US008823560B1

(12) United States Patent
Karkkainen et al.

(10) Patent No.: US 8,823,560 B1
(45) Date of Patent: Sep. 2, 2014

(54) DATA ENCODER, DATA DECODER AND METHOD

(71) Applicant: Gurulogic Microsystems Oy, Turku (FI)

(72) Inventors: Tuomas Karkkainen, Turku (FI); Ossi Mikael Kalevo, Toijala (FI)

(73) Assignee: Gurulogic Microsystems Oy, Turku (FI)

( * ) Notice: Subject to any disclaimer, the term of this patent is extended or adjusted under 35 U.S.C. 154(b) by 0 days.

(21) Appl. No.: 13/782,872

(22) Filed: Mar. 1, 2013

(30) Foreign Application Priority Data

Mar. 1, 2013 (GB) .................................. 1303660.3

(51) Int. Cl.
*H03M 7/46* (2006.01)
*H03M 5/14* (2006.01)
*H04N 7/50* (2006.01)

(52) U.S. Cl.
CPC . *H03M 5/14* (2013.01); *H03M 7/46* (2013.01); *H04N 7/50* (2013.01)
USPC ......................................... 341/63; 375/240.18

(58) Field of Classification Search
CPC .......... H03M 7/46; H03M 7/40; H03M 5/145
USPC .......... 341/63, 65, 67, 59; 375/240.18, 240.24
See application file for complete search history.

(56) References Cited

U.S. PATENT DOCUMENTS 6,781,528 B1* 8/2004 Lin et al. ........................ 341/63
2004/0178933 A1 9/2004 Umeda

FOREIGN PATENT DOCUMENTS

GB           2481870 A        1/2012

OTHER PUBLICATIONS http://en.wikipedia.org/wiki/Run-length_encoding, "Run-length encoding" printed on Sep. 24, 2013 (3 pages).
Chengjie Tu et al., Adaptive Runlength Coding, IEEE Signal Processing Letters, vol. 10, No. 3, Mar. 2003 (pp. 61-64).
Search Report Under Sections 17 dated Sep. 2, 2013; issued by UKIPO in related U.K. Patent Application No. GB1303660.3 (4 pages).
Abhinav Gupta et al., "Modified runlength coding for improved JPEG performance," International Conference on Information and Communication Technology, ICICT 2007, Mar. 7-9, 2007, Dhaka, Bangladesh, pp. 235-237 XP-031183552.
Gregory K. Wallace et al., "The JPEG Still Picture Compression Standard," 8087 IEEE Transactions on Consumer Electronics Feb. 1, 1992, New York, New York vol. 38 No. 1, pp. XVIII-XXXIV (17 pages) XP-000297354.
PCT International Search Report and Written Opinion mailed Jun. 12, 2014, which was issued by ISA/EP in a related PCT application No. PCT/EP2014/000530 filed Mar. 1, 2014 (8 pages).

* cited by examiner

*Primary Examiner* — Joseph Lauture
(74) *Attorney, Agent, or Firm* — Robert P. Michal; Lucas & Mercanti LLP

(57) ABSTRACT

An encoder is provided for encoding input data (D1) to generate corresponding encoded output data (D2). The encoder includes a data processing arrangement for generating a run-length encoded (RLE) representation of the input data (D1). Moreover, the encoder is operable to split the run-length encoded (RLE) representation into a plurality of parts (A, B), wherein at least one part is associated with original symbols and at least another part is associated with counters representative of occurrence of the original symbols. Furthermore, the encoder is operable to encode the plurality of parts (A, B) separately to generate the encoded output data (D2). There is also provided a corresponding decoder for decoding the encoded data (D2) to generate corresponding decoded output data (D3). Additionally, there is provided a coder including the aforesaid encoder and decoder.

32 Claims, 2 Drawing Sheets

DATA ENCODER, DATA DECODER AND METHOD

FIELD OF THE INVENTION

Figure 1:
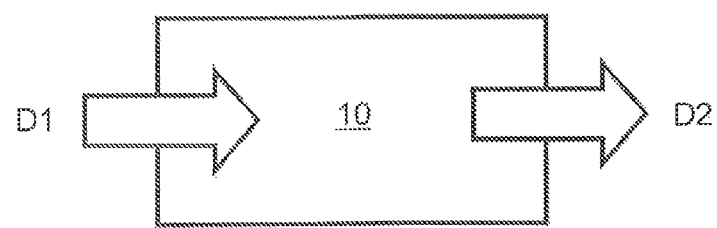

The present invention relates to data encoders, and corresponding methods of data encoding. Moreover, the present invention relates to data decoders, and corresponding methods of decoding encoded data. Furthermore, the present invention relates to software products recorded on machine-readable data storage media, wherein the software products are executable upon computing hardware for executing aforementioned methods. The data encoder, similarly the data decoder, are useable, for example, as component parts of data communication systems and data supply systems, as well as in electronic consumer products. Additionally, the present invention relates to codecs including at least one aforesaid data encoder and at least one aforesaid data decoder.

BACKGROUND OF THE INVENTION

As data is employed to an increasing extent in contemporary society, there is a need for a simple, but effective, method of providing lossless data compression, and correspondingly a simple method of providing lossless data de-compression. Conventional known run-length encoding methods of compressing data are only really effective for compressing continuous data, which is generally not so common within data communication systems which often execute packetized data exchange. Packetized data exchange within data communication systems, for example in the Internet, results in transfer of many small packets of data. However, it is well known to people skilled in the technical art of data compression that run-length encoding (RLE) is capable of providing a better data compression ratio in comparison to other known data compression techniques.

All variations of run-length encoding method employ a counter and a character of bytes which are encoded by such methods. When implementing the methods, the counter is set for each run of such characters. Moreover, there are several variations in the methods regarding how to represent the counter for the character, but these are always encoded into the same output data with the characters of bytes. In consequence, regular known RLE methods have been found to provide a relatively poor data compression ratio.

Literature representing known contemporary art is provided in Table 1.

TABLE 1

| | Known technical art |
|---|---|
| Document ref. | Detail of document |
| Document D1 | "Run-length encoding" - Wikipedia, (accessed 28 November 2012), URL: http//en.wikipedia.org/wiki/Run-length_encoding |
| Document D2 | "Huffman coding" - Wikipedia, (accessed 28 November 2012), URL: http://en.wikipedia.org/wiki/Huffman_coding |
| Document D3 | "Run Length Encoding (RLE) - Discussion and Implementation" (accessed 18 December 2012), URL: http://michael.dipperstein.com/rle/index.html |
| Document D4 | "Run Length Encoding" by Arturo Campos (accessed 18 December 2012), URL: http://www.arturocampos.com/ac_rle.html |
| Document D5 | "A Mathematical Theory of Communication" Claude E. Shannon (1948), (accessed 28 November 2012), URL: http://cm.bell-labs.com/cm/ms/what/shannonday/shannon1948.pdf |
| Document D6 | Shannon's source coding theorem - Wikipedia (accessed 28 November 2012), URL: http://en.wikipedia.org/wiki/Source_coding_theorem |
| Document D7 | "Entropy" - Wikipedia (accessed 28 November 2012), URL: http://en.wikipedia.org/wiki/Entropy |
| Document D8 | "Variable-length code" - Wikipedia (accessed 28 November 2012), URL: http://en.wikipedia.org/wiki/Arithmetic_coding |
| Document D9 | "Arithmetic coding" - Wikipedia (accessed 28 November 2012), URL: http://en.wikipedia.org/wiki/Arithmetic_coding |
| Document D10 | "Delta encoding" - Wikipedia (accessed 28 November 2012), URL: http://en.wikipedia.org/wiki/Delta_coding |

SUMMARY OF THE INVENTION

The present invention seeks to provide an improved method of compressing input data to generate corresponding compressed output data.

The present invention seeks to provide an improved method of encoding input data to generate corresponding encoded output data.

The present invention also seeks to provide an improved method of data decompression for receiving compressing input data to generate corresponding decompressed output data.

The present invention seeks to provide an improved method of decoding input data to generate corresponding decoded output data.

The present invention also seeks to provide encoders, decoders and codecs which are operable to employ aforesaid improved methods.

According to a first aspect of the present invention, there is provided an encoder as claimed in appended claim 1: there is provided an encoder for encoding input data (D1) to generate corresponding encoded output data (D2), wherein the encoder includes a data processing arrangement for generating a run-length encoded (RLE) representation of the input data (D1), wherein the encoder is operable to split the runlength encoded (RLE) representation into a plurality of parts (A, B), wherein at least one part is associated with original symbols and at least another part is associated with counters representative of occurrence of the original symbols, and the encoder is operable to encode the plurality of parts (A, B) separately to generate the encoded output data (D2).

The invention is of advantage in that the encoder is capable of providing a higher degree of substantially lossless compression in comparison to known types of encoder by handling the plurality of parts (A, B) individually.

The phrase "representative of occurrence" should be construed broadly, and is not limited to the counter which merely directly counts a number of mutually similar contiguous characters present in a stream of data.

Optionally, when the encoder is in operation, the original symbols include at least one of: characters, alphabetic elements, numbers, bits, bytes, words.

Optionally, the encoder is operable to generate the encoded output data (D2) in a compressed form relative to the input data (D1).

Optionally, the encoder is operable to encode the plurality of parts (A, B) to generate the encoded output data (D2) by employing at least one of: variable length coding (VLC), Huffman coding, Golomb coding, Arithmetic coding (Range coding), Delta coding, ODelta coding, Lempel-Ziv coding, BWT coding. More optionally, the encoder is operable to encode at least one of the plurality of parts (A, B) using run-length encoding whose maximum run length is defined by one or more escape codes in the encoded output data (D2).

Optionally, the encoder is operable to include one or more markers in the encoded output data (D2) for indicating occurrence of encoded data corresponding to each of the plurality of parts (A, B).

Optionally, the encoder is arranged such that the run-length encoded (RLE) representation is implemented in a substantially lossless manner.

According to a second aspect of the invention, there is provided a method of encoding input data (D1) in an encoder to generate corresponding encoded output data (D2), wherein the method includes using a data processing arrangement to generate a run-length encoded (RLE) representation of the input data (D1), wherein the method further includes:
 (a) using the encoder to split the run-length encoded (RLE) representation into a plurality of parts (A, B), wherein at least one part is associated with original symbols and at least another part is associated with counters representative of occurrence of the original symbols; and
 (b) using the encoder to encode the plurality of parts (A, B) separately to generate the encoded output data (D2).

The phrase "representative of occurrence" should be construed broadly, and is not limited to the counter which merely directly counts a number of mutually similar contiguous characters present in a stream of data.

Optionally, in the method, the original symbols include at least one of: characters, alphabetic elements, numbers, bits, bytes, words.

Optionally, the method includes using the encoder to generate the encoded output data (D2) in a compressed form relative to the input data (D1).

Optionally, the method includes using the encoder to encode the plurality of parts (A, B) to generate the encoded output data (D2) by employing at least one of: variable length coding (VLC), Huffman coding, Golomb coding, Arithmetic coding (Range coding), Delta coding, ° Delta coding, Lempel-Ziv coding, BWT coding. More optionally, the method includes using the encoder to encode at least one of the plurality of parts (A, B) using run-length encoding whose maximum run length is defined by one or more escape codes in the encoded output data (D2).

Optionally, the method includes using the encoder to include one or more markers in the encoded output data (D2) for indicating occurrence of encoded data corresponding to each of the plurality of parts (A, B).

Optionally, the method includes implementing the run-length encoded (RLE) representation in a substantially lossless manner.

According to a third aspect of the invention, there is provided a decoder for decoding encoded input data (D2) to generate corresponding decoded output data (D3), wherein the decoder includes a data processing arrangement for decoding the encoded input data (D2) into a plurality of separate parts (A, B), wherein at least one part is associated with original symbols and at least another part is associated with counters representative of occurrence of the original symbols, and for combining the plurality of parts (A, B) together to generate combined data for decoding via a run-length decoding process to generate the decoded output data (D3).

The phrase "representative of occurrence" should be construed broadly, and is not limited to the counter which merely directly counts a number of mutually similar contiguous characters present in a stream of data.

Optionally, when the decoder is in operation, the original symbols include at least one of: characters, alphabetic elements, numbers, bits, bytes, words, Optionally, the decoder is operable to generate the decoded output data (D3) in a decompressed form relative to the encoded input data (D2).

Optionally, the decoder is operable to decode the encoded input data (D2) to generate the plurality of parts (A, B) by employing at least one of: inverse variable length coding (VLC), inverse Huffman coding, inverse Golomb coding, inverse Arithmetic coding (inverse Range coding), inverse Delta coding, inverse ODelta coding, inverse Lempel-Ziv coding, inverse BWT coding. More optionally, the decoder is operable to decode at least one of the plurality of parts (A, B) using run-length decoding whose maximum run length is defined by one or more escape codes in the encoded input data (D2).

Optionally, the decoder is operable to indentify one or more markers in the encoded input data (D2) for determining occurrence of encoded data corresponding to each of the plurality of parts (A, B).

Optionally, the decoder is arranged such that the run-length decoding process is implemented in a substantially lossless manner.

According to a fourth aspect of the invention, there is provided a method of decoding encoded input data (D2) in a decoder to generate corresponding decoded output data (D3), wherein the method includes using a data processing arrangement, wherein the method includes:
 (a) using the decoder to decode the encoded input data (D2) into a plurality of separate parts (A, B), wherein at least one part is associated with original symbols and at least another part is associated with counters representative of occurrence of the original symbols;
 (b) using the decoder to combine the plurality of parts (A, B) to generate corresponding combined data; and
 (c) using a run-length decoding process the apply a run-length decoding process to the combined data to generate the decoded output data (D3).

The phrase "representative of occurrence" should be construed broadly, and is not limited to the counter which merely directly counts a number of mutually similar contiguous characters present in a stream of data.

Optionally, in the method, the original symbols include at least one of: characters, alphabetic elements, numbers, bits, bytes, words.

Optionally, the method includes using the decoder to generate the decoded output data (D3) in a decompressed form relative to the encoded input data (D2).

Optionally, the method includes using the decoder to decode the plurality of parts (A, B) to generate the decoded output data (D3) by employing at least one of: inverse variable length coding (VLC), inverse Huffman coding, inverse Golomb coding, inverse Arithmetic coding (inverse Range coding), inverse Delta coding, inverse ODelta coding, inverse Lempei-Ziv coding, inverse BWT coding. More optionally, the method includes using the decoder to decode at least one of the plurality of parts (A, B) using run-length encoding whose maximum run length is defined by one or more escape codes in the encoded input data (D2).

Optionally, the method includes using the decoder to identify one or more markers in the encoded input data (D2) for determining occurrence of encoded data corresponding to each of the plurality of parts (A, B).

Optionally, the method includes implementing the run-length decoding process in a substantially lossless manner.

According to a fifth aspect of the invention, there is provided a codec including an encoder pursuant to the first aspect of the invention for encoding input data (D1) to generate corresponding encoded data (D2), and a decoder pursuant to the third aspect of the invention for decoding the encoded output data (D2) to generate corresponding output decoded data (D3).

According to a sixth aspect of the invention, there is provided a software product recorded on machine-readable data storage media, wherein the software product is executable upon computing hardware for executing a method pursuant to the second aspect of the invention.

According to a seventh aspect of the invention, there is provided a software product recorded on machine-readable data storage media, wherein the software product is executable upon computing hardware for executing a method pursuant to the fourth aspect of the invention.

It will be appreciated that features of the invention are susceptible to being combined in various combinations without departing from the scope of the invention as defined by the appended claims.

DESCRIPTION OF THE DIAGRAMS

Figure 2:
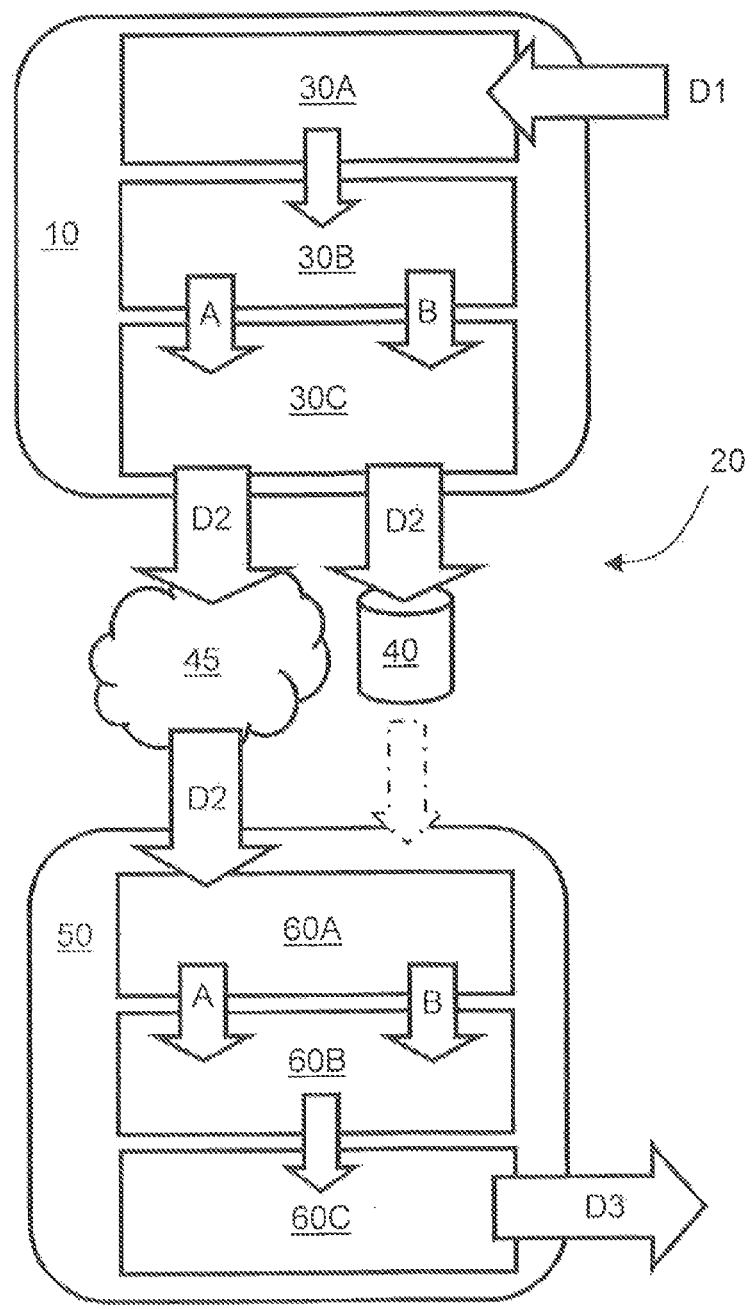

Embodiments of the present invention will now be described, by way of example only, with reference to the following diagrams wherein:

FIG. 1 is an illustration of an encoder pursuant to the present invention; and FIG. 2 is an illustration of a codec pursuant to the present invention.

In the accompanying diagrams, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DESCRIPTION Of EMBODIMENTS OF THE INVENTION

In overview, the present invention is based upon a run-length encoding (RLE) method, but provides a significant improvement thereupon.

RLE methods are contemporarily employed to encode various types of graphical information, for example multimedia data formats, for example in a lossless manner. However, such RLE methods do not perform well for continuous-tone images, for example photographs, as well as non-formalized data. Nevertheless, convention RLE is employed in apparatus such as facsimile machines, usually in combination with Huffman-coding and employing standard contemporary formats such as BMP, GIF, PCX, TIFF and such like.

Embodiments of the present invention are concerned with a simple solution for achieving improved data compressing and encoding which provides an enhanced data compression ratio in comparison to contemporary known RLE methods. Moreover, embodiments of the present invention employ a counter, akin to RLE, but with a difference that associated characters are written separately to their own respective data output parts, namely part A and part B respectively. Such separation in mutually different parts is in contradistinction to contemporary RLE approaches where character definition and run-length information are intermixed together.

Thus, embodiments of the present invention concern a novel split run-length method, namely "SRLE" which is effective for both pre-processing and post-processing of continuous data, namely for all types of 1D, 2D and 3D data, for example including graphics, images, video, audio, text, and binary data. The split run-length method is updatable for networking purposes, for implementation in devices, microprocessors is and similar. Moreover, the split run-length method is susceptible to being implemented using one or more software products stored on machine-readable data storage media, wherein the software products are executable upon computing hardware.

Referring to FIG. 1, there is provided an illustration of an encoder 10, for example implemented by way of digital hardware and/or one or more software products stored on machine-readable data-storage media and executable upon computing hardware, which is operable to receive input data D1 and generate corresponding encoded output data D2. For such an encoder 10, it is possible to calculate an entropy E1 of the input data D1, as well as an entropy E2 of the output data D2. The entropies E1, E2 are manifest in a number of bits required to provide a given set of data.

For elucidating a manner of operation of the encoder 10, an example run length (RL) is usually expressed in one or more byte values. However, for elucidating embodiments of the present invention, alpha-numerical characters will be described here. The input data D1 is represented by a string of characters as follows:

$$WWW\ WWW\ WWW\ WWW\ BWW\ WWW\ WWW$$
$$WWW\ WBB\ BWW\ WWW\ WWW\ WWW$$
$$WWW\ WWW\ WWW\ WWW\ WBW\ WWW$$
$$WWW\ WWW\ WWW\ W \qquad \text{Eq. 1}$$

The entropy E1 associated with such a string of characters is sixty two "W" characters and five "B" characters which is susceptible to being represented by 25.66 bits, as calculable from Equation 2 (Eq. 2) and Equation 3 (Eq. 3):

$$L = \frac{E}{\log_{10} N} \quad \text{Eq. 2}$$

Shannon's theory has indentified that an average length L of a shortest possible representation to encode a given message in a given alphabet is their entropy E divided by a logarithm of a number of symbols N present in the alphabet.

$$M_B = \frac{E}{\log_{10}(2)} = 25.66 \text{ bits} \quad \text{Eq. 3}$$

The series of characters above is susceptible to being encoding using two alternative known RLE methods to generate the output data D2 as an RLE series:

12W 1B 12W 3B 24W 1B 14W    Eq. 4 with an associated calculated entropy E2 corresponding to 26.55 bits, alternatively the output data D2 as an RLE series:

WW10BWW10BB1WW22BWW12    Eq. 5 with an associated calculated entropy E2 corresponding to 35.49 bits.

Equation 4 (Eq. 4) is a simple expression of a given character preceded by a number indicative of occurrences of the given character, namely twelve "W" followed by one "B" followed by twelve "W" and so forth. Conversely, in Equation 5 (Eq. 5), the characters represent corresponding characters in sequence in Equation 1 (Eq. 1) followed an indication of occurrences thereof thereafter.

Such known RLE methods result in a greater entropy in the encoded output data D2 than present in the input data D1, namely E2>E1, although there occurs a reduction in a total number of symbols present in the output data D2. It is known to compress RLE data by applying further coding thereto, for example Huffman coding, variable length coding (VLC), but result in sub-optimal data compression results. Such sub-optimal performance arises on account of a mismatch of formats.

It will be appreciated that Equations 4 (Eq. 4) and Equation 5 (Eq. 5) are a mixture of characters, denoted by part A, and a counter associated with the characters, namely part B; such parts are designated in Table 2 in respect of Equations 1 (Eq. 1), Equation 4 (Eq. 4) and Equation 5 (Eq. 5):

When the encoder 10 functions pursuant to the present invention, the output data D2 is not in a mixed form as in Equations 4 and 5 (Eq. 4 and Eq. 5), but part A and part B are expressed separately, namely are split, and their mutual correspondence is defined by a structure of the encoded data D2, for example defined by one or more markers.

Pursuant to an example embodiment of the present invention, in Equation 1 (Eq. 1), the input data D1 has associated therewith the Entropy E1 of 25.66 bits. Equation 1 sequence of characters is run-length encoded (RLE) into two put parts:
Part A: 12 1 12 3 24 1 14
Part B: W B W B W B W, wherein Part A has an associated calculated entropy $E_A$ of 15.65 bits, and Part B has an associated calculated entropy $E_B$ of 6.90 bits. Such parts are derived from Equation 4 (Eq. 4) in the foregoing. The total sum of the entropies $E_A$, $E_B$ is 22.55 bits, which is 3.11 bits less, namely 12% less, than pertains to the input data D1, and 14.00 bits less, namely 38% less, than code generated by the known conventional RLE, namely 36.55 bits. Thus, beneficial data compression is susceptible to being achieved pursuant to the present invention by splitting counter and character information generated by RLE, and then applying a compression method, for example VLC coding, Huffman coding, Golomb coding, Arithmetic coding (Range coding), Delta coding, ODelta coding, Lempel-Ziv coding, BWT coding or similar. Optionally, such coding is applied prior to the encoder 10; optionally, corresponding decoding is also included in the decoder 50.

Optionally, in the encoder 10, the part B and/or the part A is encoded using, for example, variable-length coding (VLC), having a maximum allowable run length and one or more associated escape codes in the data D2 to indicate escape from a given maximum run length of symbols present in the data D2. Similarly, the decoder 50 is implemented to identify one or more such escape codes present in the data D2 received thereat, wherein the one or more escape codes are interpreted in the decoder 50 when decoding the data D2, namely when regenerating the part A and/or the part B.

Pursuant to another example embodiment of the present invention, in Equation 1 (Eq. 1), the input data D1 has associated therewith the Entropy E1 of 25.66 bits. Equation 1 sequence of characters is run-length encoded (RLE) into two put parts:
Part A: 10 10 1 22 12
Part B: W W B W W B W W B W W,
wherein Part A has an associated calculated entropy $E_A$ of 9.61 bits, and Part B has an associated calculated entropy $E_B$ of 11.02 bits. Such parts are derived from Equation 5 (Eq. 5)

TABLE 2

| | Parts A and B pursuant to the present invention | | | | | | | |
|---|---|---|---|---|---|---|---|---|
| Eq. 1 | WWW WWW WWW WWW | B | WW WWW WWW WWW W | BB B | WW WWW WWW WWW WWW WWW WWW WWW W | B | W WWW WWW WWW WWW W |
| RLE method 1: pad B (Eq. 4) | 12 | 1 | 12 | 3 | 24 | 1 | 14 |
| RLE method 1: part A (Eq. 4) | W | B | W | B | W | B | W |
| RLE method 2: Part B (Eq. 5) | 10 | | 10 | 1 | 22 | | 12 |
| RLE method 2: Part A (Eq. 5) | WW | B | WW | BB | WW | B | WW | in the foregoing. The total sum of the entropies $E_A$, $E_B$ is 20.63 bits, which is 5.03 bits less, namely 20% less, than pertains to the input data D1, and 14.86 bits less, namely 42% less, than code generated by the known conventional RLE, namely 36.55 bits. Thus, beneficial data compression is susceptible to being achieved pursuant to the present invention by splitting counter and character information generated by RLE, and then applying a compression method, for example VLC coding, Huffman coding or similar.

The aforementioned example embodiments clearly illustrate an advantage derived from applying a RLE method in the input data D1 to generate corresponding RLE data, then splitting such RLE data into a character part, namely aforesaid part B, and a corresponding run-length count part, namely aforesaid part A, wherein data pertaining to parts A and B are mutually split apart, and then applying encoding to the parts separately to generate the encoded output data D2. Optionally, additional codes, for example one or more markers, are included to indicate which portions of the encoded output data D2 correspond to part A and which correspond to part B, namely for assisting corresponding subsequent decoding activities. Such data encoding processing is beneficially implemented in the encoder 10 of FIG. 1 implemented functionally in a manner as depicted in FIG. 2.

In FIG. 2, there is shown a codec indicated generally by 20. The codec 20 includes the encoder 10 arranged to implement a method of encoding the input data D1 pursuant to the present invention to generate corresponding encoded output data D2. The encoder 10 is beneficially implemented in digital hardware, for example as computing hardware which is operable to execute one or more software products recorded on machine-readable data storage media. The encoder 10 is operable to perform three functions as follows:

- (a) a first stage 30A of the encoder 10 is operable to process the input data D1 to determine its characters, or generate a character representation thereof, and to generate corresponding run-length counts;
- (b) a second stage 30B of the encoder 10 is operable to split the characters and their corresponding run-length counts generated in the first stage 30A into two parts, namely parts B and A respectively, in a structured manner; and
- (c) a third stage 30C of the encoder 10 is operable to encode data of the parts A and B, for example via Huffman or variable length coding (VLC), to generate the output encoded data D2.

The output data D2 is optionally stored on a data carrier 40, for example an optical data storage disc memory. Alternatively, the output data D2 is communicated via a data communication network 45, for example the Internet, to a decoder 50 of the codec 20. The decoder 50 is beneficially implemented in digital hardware, for example as computing hardware which is operable to execute one or more software products recorded on machine-readable data storage media. Moreover, the decoder 50 is operable to perform an inverse of processing operations executed by the encoder 10 when in operation, namely the decoder 50 is operable to perform three functions as follows:

- (i) a first stage 60A of the decoder 50 is operable to receive the encoded data D2 and to decode data of the parts A and B, for example via inverse Huffman or inverse variable length coding (VLC), to regenerate the parts A and B;
- (ii) a second stage 60B of the decoder 50 is operable to combine the regenerated parts A and B from the first stage 60A to generate the characters and their corresponding run-length counts as mixed data; and
- (iii) a third stage 60C of the decoder 50 is operable to apply inverse run-length encoding to the mixed data to regenerate therefrom decoded output data D3.

Optionally, at least one of the encoder 10 and the decoder 50 is implemented in electronics consumer products, for example televisions, smart phones, fax machines, tablet computers, personal computers (PC's), video recorders, video players, digital cameras, video-conferencing systems, surveillance equipment, portable personal multimedia players to mention merely a few practical applications.

Although splitting of encoded data into two parts, namely parts A and B, is described in the foregoing in respect of the present invention, it will be appreciated that splitting of encoding data into more than two parts is optionally possible for multi-dimensional data. Moreover, although combining of decoded data corresponding to two parts, namely parts A and B, is described in the foregoing in respect of the present invention, it will be appreciated that combining of more than two parts is optionally possible for multi-dimensional data.

Modifications to embodiments of the invention described in the foregoing are possible without departing from the scope of the invention as defined by the accompanying claims. Expressions such as "including", "comprising", "incorporating", "consisting of", "have", "is" used to describe and claim the present invention are intended to be construed in a non-exclusive manner, namely allowing for items, components or elements not explicitly described also to be present. Reference to the singular is also to be construed to relate to the plural. Numerals included within parentheses in the accompanying claims are intended to assist understanding of the claims and should not be construed in any way to limit subject matter claimed by these claims.

We claim:

1. An encoder for encoding input data (D1) to generate corresponding encoded output data (D2), wherein the encoder includes a data processing arrangement for generating a run-length encoded (RLE) representation of the input data (D1), wherein the encoder is operable to split the run-length encoded (RLE) representation into a plurality of parts (A, B), wherein at least one part is associated with original symbols and at least another part is associated with counters representative of occurrence of the original symbols, and the encoder is operable to encode the plurality of parts (A, B) separately to generate the encoded output data (D2).

2. The encoder as claimed in claim 1, wherein the original symbols include at is least one of: characters, alphabetic elements, numbers, bits, bytes, words.

3. The encoder as claimed in claim 2, wherein the encoder is operable to generate the encoded output data (D2) in a compressed form relative to the input data (D1).

4. The encoder as claimed in claim 1, wherein the encoder is operable to encode the plurality of parts (A, B) to generate the encoded output data (D2) by employing at least one of: variable length coding (VLC), Huffman coding, Golomb coding, Arithmetic coding (Range coding), Delta coding, Lempel-Ziv coding, BWT coding.

5. The encoder as claimed in claim 4, wherein the encoder is operable to encode at least one of the plurality of parts (A, B) using run-length encoding whose maximum run length is defined by one or more escape codes in the encoded output data (D2).

6. The encoder as claimed in claim 1, wherein the encoder is operable to include one or more markers in the encoded output data (D2) for indicating occurrence of encoded data corresponding to each of the plurality of parts (A, B).

7. The encoder as claimed in claim 1, wherein the run-length encoded (RLE) representation is implemented in a substantially lossless manner.

8. A coder including an encoder as claimed in claim 1 for encoding input data (D1) to generate corresponding encoded data (D2).

9. A method of encoding input data (D1) in an encoder to generate corresponding encoded output data (D2), wherein the method includes using a data processing arrangement to generate a run-length encoded (RLE) representation of the input data (D1), wherein the method further includes:
   (a) using the encoder to split the run-length encoded (RLE) representation into a plurality of parts (A, B), wherein at least one part is associated with original symbols and at least another part is associated with counters representative of occurrence of the original symbols; and
   (b) using the encoder to encode the plurality of parts (A, B) separately to generate the encoded output data (D2).

10. The method of encoding input data (D1) as claimed in claim 9, wherein the original symbols include at least one of: characters, alphabetic elements, numbers, bits, bytes, words.

11. The method as claimed in claim 9, wherein the method includes using the encoder (10) to generate the encoded output data (D2) in a compressed form relative to the input data (D1).

12. The method as claimed in claim 9, wherein the method includes using the encoder to encode the plurality of parts (A, B) to generate the encoded output data (D2) by employing at least one of: variable length coding (VLC), Huffman coding, Golomb coding, Arithmetic coding (Range coding), Delta coding, Lempel-Ziv coding, BWT coding.

13. The method as claimed in claim 12, wherein the method includes using the encoder to encode at least one of the plurality of parts (A, B) using run-length encoding whose maximum run length is defined by one or more escape codes in the encoded output data (D2).

14. The method as claimed in claim 9, wherein the method includes using the encoder to include one or more markers in the encoded output data (D2) for indicating occurrence of encoded data corresponding to each of the plurality of parts (A, B).

15. The method as claimed in claim 9, wherein the method includes implementing the run-length encoded (RLE) representation in a substantially lossless manner.

16. A software product recorded on machine-readable data storage media, wherein the software product is executable upon computing hardware for executing a method as claimed in claim 9.

17. A decoder for decoding encoded input data (D2) to generate corresponding decoded output data (D3), wherein the decoder includes a data processing arrangement for decoding the encoded input data (D2) into a plurality of separate parts (A, B), wherein at least one part is associated with original symbols and at least another part is associated with counters representative of occurrence of the original symbols, and for combining the plurality of parts (A, B) together to generate combined data for decoding via a run-length decoding process to generate the decoded output data (D3).

18. The decoder as claimed in claim 17, wherein the original symbols include at least one of: characters, alphabetic elements, numbers, bits, bytes, words.

19. The decoder as claimed in claim 17, wherein the decoder is operable to generate the decoded output data (D3) in a decompressed form relative to the encoded input data (D2).

20. The decoder as claimed in claim 17, wherein the decoder is operable to decode the encoded input data (D2) to generate the plurality of parts (A, B) by employing at least one of: inverse variable length coding (VLC), inverse Huffman coding, inverse Golomb coding, inverse Arithmetic coding (inverse Range coding), inverse Delta coding, inverse Lempel-Ziv coding, inverse BWT coding.

21. The decoder as claimed in claim 20, wherein the decoder is operable to decode at least one of the plurality of parts (A, B) using run-length decoding whose maximum run length is defined by one or more escape codes in the encoded input data (D2).

22. The decoder as claimed in claim 17, wherein the decoder is operable to indentify one or more markers in the encoded input data (D2) for determining occurrence of encoded data corresponding to each of the plurality of parts (A, B).

23. The decoder as claimed in claim 17, wherein the run-length decoding process is implemented in a substantially lossless manner.

24. A codec (20) including a decoder (50) as claimed in claim 17 for decoding the encoded output data (D2) to generate corresponding output decoded data (D3).

25. A method of decoding encoded input data (D2) in a decoder to generate corresponding decoded output data (D3), wherein the method includes using a data processing arrangement, wherein the method includes:
   (a) using the decoder to decode the encoded input data (D2) into a plurality of separate parts (A, B), wherein at least one part is associated with original symbols and at least another part is associated with counters representative of occurrence of the original symbols;
   (b) using the decoder to combine the plurality of parts (A, B) to generate corresponding combined data; and
   (c) using a run-length decoding process to apply a run-length decoding process to the combined data to generate the decoded output data (D3).

26. The method as claimed in claim 25, wherein the original symbols include at least one of: characters, alphabetic elements, numbers, bits, bytes, words.

27. The method as claimed in claim 25, wherein the method includes using the decoder to generate the decoded output data (D3) in a decompressed form relative to the encoded input data (D2).

28. The method as claimed in claim 25, wherein the method includes using the decoder to decode the plurality of parts (A, B) to generate the decoded output data (D3) by employing at least one of: inverse variable length coding (VLC), inverse Huffman coding, inverse Golomb coding, inverse Arithmetic coding (inverse Range coding), inverse Delta coding, inverse Lempel-Ziv coding, inverse BWT coding.

29. The method as claimed in claim 28, wherein the method includes using the decoder to decode at least one of the plurality of parts (A, B) using run-length encoding whose maximum run length is defined by one or more escape codes in the encoded input data (D2).

30. The method as claimed in claim 25, wherein the method includes using the decoder to identify one or more markers in the encoded input data (D2) for determining occurrence of encoded data corresponding to each of the plurality of parts (A, B).

31. The method as claimed in claim 25, wherein the method includes implementing the run-length decoding process in a substantially lossless manner.

32. A software product recorded on machine-readable data storage media, wherein the software product is executable upon computing hardware for executing a method as claimed in claim 25.

* * * * *